(12) United States Patent
Ben-Ayun et al.

(10) Patent No.: US 8,139,676 B2
(45) Date of Patent: Mar. 20, 2012

(54) WIRELESS COMMUNICATION UNIT, LINEARISED TRANSMITTER CIRCUIT AND METHOD OF LINEARISING THEREIN

(75) Inventors: Moshe Ben-Ayun, Shoham (IL); Paul H. Gailus, Prospect Heights, IL (US); Ovadia Grossman, Tel Aviv-Yaffo (IL); Mark Rozental, Gedera (IL)

(73) Assignee: Motorola Solutions, Inc., Schaumburg, IL (US)

( * ) Notice: Subject to any disclaimer, the term of this patent is extended or adjusted under 35 U.S.C. 154(b) by 989 days.

(21) Appl. No.: 11/623,842

(22) Filed: Jan. 17, 2007

(65) Prior Publication Data
US 2008/0170637 A1 Jul. 17, 2008

(51) Int. Cl.
*H04L 27/36* (2006.01)
(52) U.S. Cl. ......... 375/298; 370/206; 375/261; 375/316
(58) Field of Classification Search .................. 329/304; 341/143; 370/252, 335, 342; 375/130, 141, 375/149, 232, 235, 297, 298, 355; 455/561
See application file for complete search history.

(56) References Cited

U.S. PATENT DOCUMENTS

| | | | |
|---|---|---|---|
| 5,066,923 A | 11/1991 | Gailus | |
| 5,175,879 A | 12/1992 | Ellingson et al. | |
| 6,121,910 A * | 9/2000 | Khoury et al. | 341/143 |
| 6,639,950 B1 | 10/2003 | Lagerblom et al. | |
| 6,731,694 B2 | 5/2004 | Bozeki | |
| 6,940,916 B1 | 9/2005 | Warner | |
| RE38,876 E * | 11/2005 | Samueli et al. | 375/235 |
| 7,397,863 B2 * | 7/2008 | Jensen | 375/296 |
| 7,421,252 B2 | 9/2008 | Kirschenmann et al. | |
| 2002/0181611 A1 | 12/2002 | Kim | |
| 2005/0123064 A1 | 6/2005 | Ben-Ayun | |
| 2006/0097801 A1 * | 5/2006 | Adan | 331/46 |
| 2006/0226901 A1 * | 10/2006 | Capofreddi et al. | 330/107 |
| 2006/0234654 A1 * | 10/2006 | Ben-Ayun et al. | 455/126 |
| 2007/0257737 A1 * | 11/2007 | Van De Beek et al. | 331/76 |

FOREIGN PATENT DOCUMENTS

| | | | |
|---|---|---|---|
| GB | 2272133 A | 5/1994 | |
| GB | 2408860 A | 6/2005 | |

OTHER PUBLICATIONS

Shmelev, O., A two-channel multitone computer audio-frequency generator, Measurement Techniques, Jan. 23, 2006, pp. 57-58.*
USA Office Action Dated Jun. 29, 2009 for Related U.S. Appl. No. 11/623,848.
PCT International Search Report Dated Apr. 16, 2008 for Related U.S. Appl. No. 11/623,848.
USA Office Action Dated May 27, 2010 for Related U.S. Appl. No. 11/623,848.
Great Britain Office Action Dated Oct. 19, 2010 for Related U.S. Appl. No. 11/623,848.
USA Office Action Dated Apr. 15, 2011 for Related U.S. Appl. No. 11/623,848.

* cited by examiner

*Primary Examiner* — Erin File
(74) *Attorney, Agent, or Firm* — Valerie M. Davis; Kenneth A. Haas

(57) ABSTRACT

A wireless communication unit includes a frequency generation circuit, and a linearised transmitter operably coupled to the frequency generation circuit and having a forward path for routing a signal to be transmitted; and a feedback path, operably coupled to a power amplifier and the forward path for feeding back a portion of the signal to be transmitted. The feedback path and forward path form two loops in quadrature. The frequency generation circuit includes independent phase shift elements arranged to independently phase shift the two loops in quadrature ('I' and 'Q').

20 Claims, 4 Drawing Sheets

WIRELESS COMMUNICATION UNIT, LINEARISED TRANSMITTER CIRCUIT AND METHOD OF LINEARISING THEREIN

CROSS-REFERENCE TO RELATED APPLICATIONS

The present application is related to the following applications commonly owned together with this application by Motorola, Inc.:

U.S. Ser. No. 11/623,848, filed Jan. 17, 2007, titled WIRELESS COMMUNICATION UNIT, LINEARISED TRANSMITTER CIRCUIT AND METHOD OF LINEARISING THEREIN; and U.K. Serial No. GB 0700866.7, filed Jan. 17, 2007, titled WIRELESS COMMUNICATION UNIT, LINEARISED TRANSMITTER CIRCUIT AND METHOD OF LINEARISING THEREIN.

TECHNICAL FIELD

The technical field relates generally to a radio transmitter in a wireless communication unit. The technical field is applicable to, but not limited to, a mechanism for phase shifting in a radio transmitter that employs a linearisation technique in order to provide a stable, linear output.

BACKGROUND

Wireless communication systems, for example cellular telephony or private mobile radio (PMR) communication systems, typically provide for radio telecommunication links to be arranged between a plurality of base transceiver stations (BTSs) and a plurality of subscriber units, often termed mobile stations (MSs). The term mobile station generally includes both hand-portable and vehicular mounted radio units. Radio frequency (RF) transmitters are located in both BTSs and MSs in order to facilitate wireless communication between the communication units.

In the related technical field, it is known that there is continuing pressure on a limited radio spectrum available for radio communication systems, which is focusing attention on a development of spectrally efficient linear modulation schemes. By using spectrally efficient linear modulation schemes, more communication units are able to share allocated spectrum within a defined geographical coverage area (communication cell). An example of a digital mobile radio system that uses a linear modulation method, such as π/4 digital quaternary phase shift keying (DQPSK), is a TErrestrial Trunked RAdio (TETRA) system, developed by the European Telecommunications Standards Institute (ETSI).

Since envelopes of these linear modulation schemes fluctuate, intermodulation products can be generated in non-linear RF power amplifier(s) (PAs). Specifically in the digital PMR market, restrictions on out-of-band (interfering) emissions are severe (to an order of −60 dBc to −70 dBc relative to a power in adjacent frequency channels). Hence, linear modulation schemes used in this scenario require highly linear transmitters.

An actual level of linearity needed to meet particular out-of-band emission limits, is a function of many parameters, of which the most critical parameters are modulation type and bit rate. Quantum processes within a typical RF PA device are non-linear by nature. A straight line may only approximate a transfer function of the power amplifier when a small portion of consumed direct current (DC) power is transformed into RF power, as in an ideal linear amplifier case. This mode of operation provides a low efficiency of DC to RF power conversion, which is unacceptable for portable units.

One emphasis in portable PMR equipment is to increase battery life. Hence, it is useful to maximise operating efficiencies of the amplifiers used. To achieve both linearity and efficiency, so called linearisation techniques are used to improve a linearity performance of the more efficient classes of amplifier, for example class AB, B or C amplifiers. One such linearisation technique, often used in designing linear transmitters, is Cartesian Feedback. This is a 'closed loop' negative feedback technique, which sums a baseband feedback signal in its digital 'I' and 'Q' formats with a corresponding generated 'I' and 'Q' input signals in a forward path. Linearising of the PA output requires accurate setting and on-going control of a phase and amplitude of a feedback signal. Details of an operation of such a linearisation technique are described in the paper "Transmitter Linearisation using Cartesian Feedback for Linear (time division multiple access) TDMA Modulation" by M. Johansson and T. Mattsson 1991 IEEE.

A lineariser circuit optimises a performance of a transmitter, for example to comply with linearity or output power specifications of a communication system, or to optimise an operating efficiency of the transmitter power amplifier. Operational parameters of the transmitter are adjusted to optimise the transmitter performance and include, as an example, one or more of the following: amplifier bias voltage level, input power level, phase shift of a signal around a feedback path. Such adjustments are performed by say, a microprocessor. Due to a sensitivity performance of such transmitter circuits, a range of control and adjustment circuits and/or components are needed so that a linear and stable output signal can be achieved under all operating circumstances.

All linearisation techniques require a finite amount of time in which to linearise the performance of a given amplifying device. The 'linearisation' of the amplifying device is often achieved by initially applying a training sequence to a lineariser circuit and the amplifying device in order to determine levels of phase and gain distortion introduced by the linearisation loop and the amplifying device. Once phase and gain distortion levels have been determined, they can be compensated for, generally by adjusting feedback components/parameters.

To accommodate for such linearisation requirements, communication systems typically allocate specific training periods for individual users to train their transmitters. The TErrestrial Trunked RAdio (TETRA) standard includes a time frame, termed a Common Linearisation Channel (CLCH) as is described in UK Patent Application No. 9222922.8, to provide a full-training period approximately once every second. The CLCH frame allows a radio to 'train' prior to gaining access to the TETRA communication system. However, a radio having to wait up to one second before training and then accessing the system is undesirable. To minimise the effect of this significant delay in call set-up times, and also provide an additional period for fine tuning a radio's output characteristics, due to changes in temperature, supply voltage or frequency of operation, a reduced training sequence has been inserted at the beginning of each TETRA traffic time slot for a radio allocated that slot to perform a minimal amount of training or fine tuning. This period may be used for phase training.

An example of such a training sequence is described in U.S. Pat. No. 5,066,923 of Motorola Inc., which describes a training scheme where a phase of a transmitter amplifier is adjusted in an 'open-loop' mode and a gain of the transmitter amplifier is adjusted when a feedback loop is closed.

During phase training, a Cartesian feedback loop may be configured to be 'open loop', for example, a switch may be used to prevent the fed-back signal from being combined with a signal routed through the transmitter.

FIG. 1 illustrates a phase diagram 100 with a perfect I/Q quadrature balance, namely a 90-degree phase difference between the 'I'-channel 120 and the 'Q'-channel 110. One known method for controlling/setting phase and amplitude levels around the feedback loop is described here. The Cartesian loop is opened and a positive baseband signal applied to an input of the 'I'-channel. Phase training control circuitry monitors a signal before switching on the 'Q'-channel—indicated as Vfq 140. A successive approximation register (SAR) phase training algorithm controls a phase shifter and is arranged to minimise the Vfq voltage. Once the SAR algorithm has completed, a phase correction signal corrects a loop phase from Vfq 140 to Vfq_t 130 by an angle ☐ 150. A voltage value measured on the 'Q'-channel prior to the switch may then be reduced to a level close to zero. A same process may be repeated for a negative baseband signal input to the 'I'-channel. Calculated results from both positive and negative training applied to the 'I'-channel are averaged and used to adjust the phase shift around both the 'I'-channel loop and the 'Q'-channel loop.

In practice, a perfect I-Q 90-degree relationship is rarely achieved. This imbalance results from various component tolerances within the respective 'I' and 'Q' loops.

It is known that polyphase quadrature generators, which are commonly used to generate I-Q signals, are inherently narrowband in nature. Therefore, in order to cover frequency bands of 100-1000 MHz, or possibly 100 MHz-5 GHz, many polyphase quadrature generators are needed in known frequency generator circuits to cover the desired bandwidth. Alternatively, it is possible to use a number of frequency doublers and divide-by-2 quadrature generators. This also provides a wideband solution. However, employing such an approach may create two problems that may need to be addressed:

(i) High noise from frequency doublers; and
(ii) IQ phase ambiguity during phase training.

It is also known that phase adjustments are performed on a downmixer during a transmit time slot, as described, for example in U.S. Pat. No. 6,731,694, in order to remove a need for a costly and large circulator. However, such phase adjustments have been found to cause adjacent channel interference (sometimes referred to as 'splatter').

Thus, there currently exists a need to provide an improved wireless communication unit, a transmitter linearisation integrated circuit, and an improved method of linearising a transmitter in a wireless communication unit, wherein the above-mentioned disadvantages may be alleviated.

SUMMARY OF THE INVENTION

According to the invention in a first aspect there is provided a wireless communication unit as defined in claim 1 of the accompanying claims.

According to the invention in a second aspect there is provided a linearised transmitter integrated circuit being as defined in claim 9 of the accompanying claims.

According to the invention in a third aspect there is provided a method of linearising a transmitter in a wireless communication unit as defined in claim 16 of the accompanying claims.

Further features of the invention are as defined in the accompanying dependent claims and are disclosed in the embodiments of the invention to be described.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the invention.

DESCRIPTION OF EMBODIMENTS OF THE INVENTION

Figure 1:
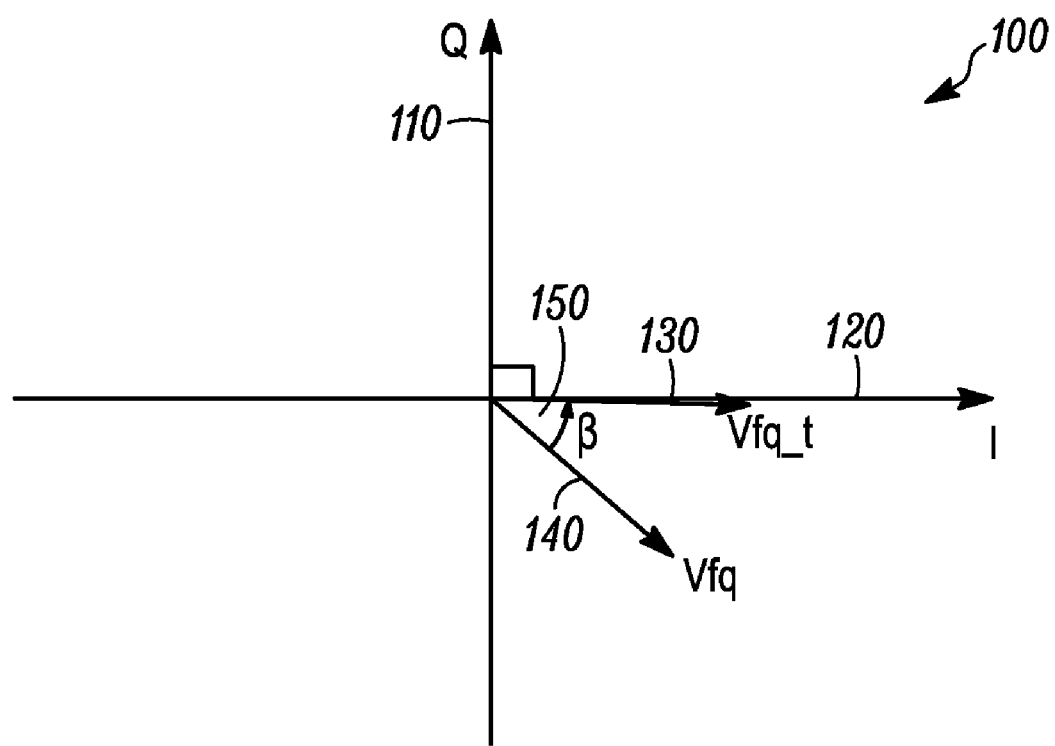
FIG. 1 shows a phase diagram of an ideal I-Q relationship in a feedback loop of a linear transmitter arrangement.

Before describing in detail embodiments that are in accordance with the invention, it should be observed that the embodiments reside primarily in combinations of method steps and apparatus components related to a method of generating a linearised transmitter signal. Accordingly, the apparatus components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

It will be appreciated that embodiments of the invention described herein may be comprised of one or more generic or specialized processors (or "signal processors") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for linearising a transmitter described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Both the state machine and ASIC are considered herein as a "signal processor" for purposes of the foregoing discussion and claim language.

Moreover, an embodiment of the invention can be implemented as a computer-readable storage element having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Generally speaking, the various embodiments provide a linearised transmitter architecture that comprises a new quadrature generation and phase shifting architecture. The proposed linearised transmitter architecture may, in some embodiments, solve a number of problems and/or provide a number of advantages over the known prior art.

Figure 2:
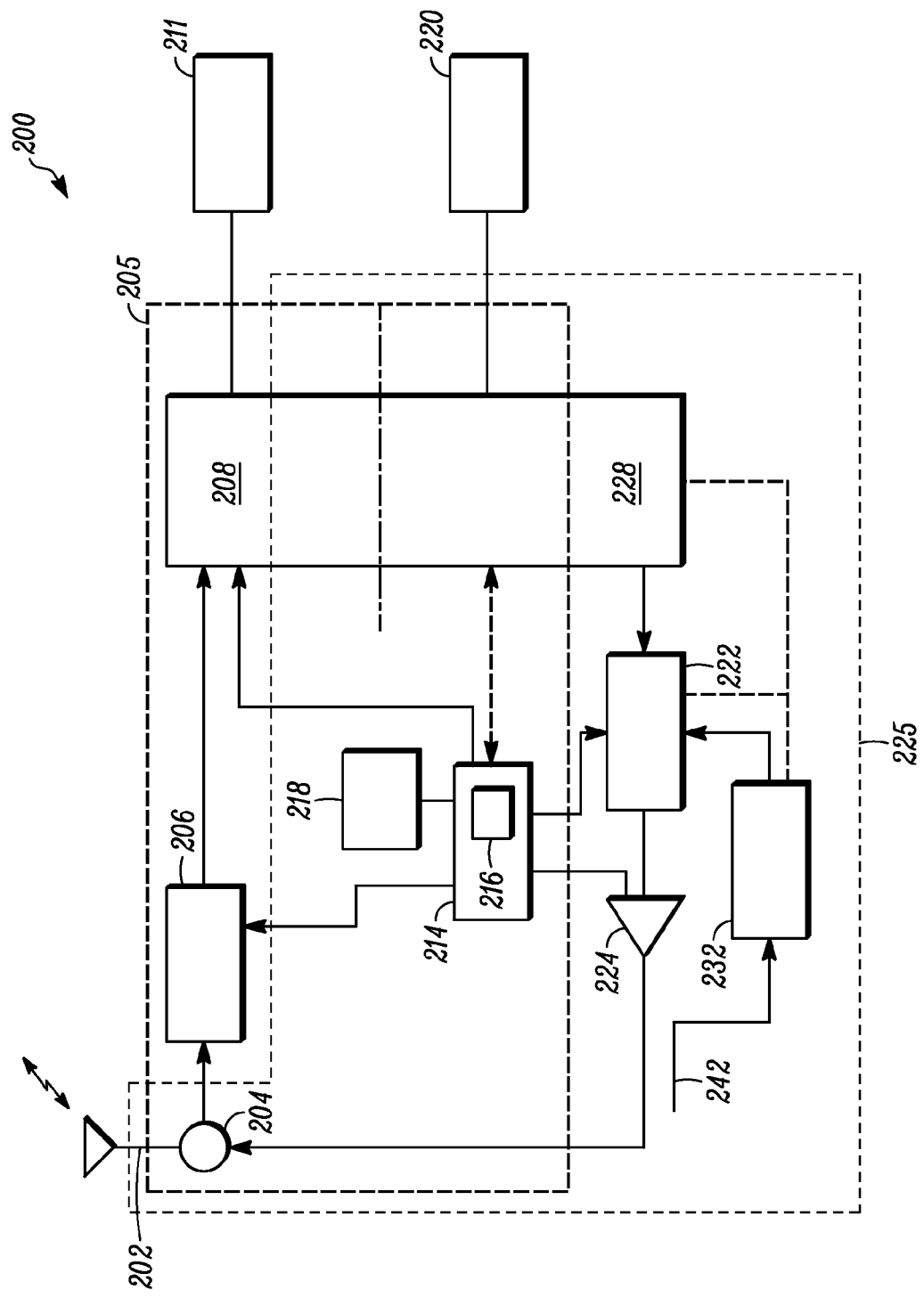
FIG. 2 illustrates a block diagram of a wireless communication unit adapted to support embodiments of the invention.

Referring now to FIG. 2, a block diagram of a wireless communication unit 200 adapted to support the inventive concept of embodiments of the invention, is illustrated. For the sake of clarity, the wireless communication unit 200 is shown as divided into two distinct portions—a receiver chain 205 and a transmitter chain 225.

The wireless communication unit 200 contains an antenna 202. The antenna 202 is coupled to an antenna switch 204 that provides signal control of radio frequency (RF) signals in the wireless communication unit 200, as well as isolation between the receiver chain 205 and transmitter chain 225. Clearly, the antenna switch 204 may be replaced in some embodiments of the invention with a duplex filter, for frequency duplex communication units as is known to those skilled in the art.

For completeness, the receiver 205 of the wireless communication unit 200 will be briefly described. The receiver 205 includes a receiver front-end circuit 206 (effectively providing reception, filtering and intermediate or base-band frequency conversion). The front-end circuit 206 is serially coupled to a signal processing function (generally realised by at least one digital signal processor (DSP)) 208. An output from the at least one digital signal processor 208 is provided to a user interface 211, which in a receiving context may comprise a suitable output device, such as a screen or loudspeaker. A controller 214 is operably coupled to the front-end circuit 206. A memory device 216 stores a wide array of data, such as decoding/encoding functions and the like, as well as amplitude and phase settings for the linearised transmitter to ensure a linear and stable output. A timer 218 is operably coupled to the controller 214 to control the timing of operations, namely the transmission or reception of time-dependent signals.

As regards the transmit chain 225, this essentially includes an input device 220, such as a keypad, or microphone operably coupled to signal processing logic 228 and thereafter lineariser circuitry (including transmitter/modulation circuitry) 222 and an up-converter/power amplifier 224. A skilled artisan will appreciate that the signal processing logic 228 in the transmit chain may be implemented as distinct from the at least one digital signal processor 208 in the receive chain. Alternatively, a single processor may be used to implement processing of both transmit and receive signals, as shown in FIG. 2. In accordance with embodiments of the invention, as described hereafter, the signal processing logic 228, lineariser circuitry 222 and the up-converter/power amplifier 224 are operationally responsive to the controller 214, with an output from the power amplifier 224 coupled to the antenna switch 204. A feedback circuit includes a down-converter 232, which forms together with the lineariser circuitry 222 power amplifier 224 and a directional coupler 242 a real-time Cartesian feedback loop to ensure a linear, stable transmitter output.

Prior to transmitting real data, the linearised transmitter of the embodiments of the invention employs a training algorithm, to determine appropriate gain and phase adjustment parameters to ensure a stable, linear output. Notably, embodiments of the invention may utilise the training algorithm described in U.S. Pat. No. 5,066,923 to Motorola Inc., which is incorporated herein by reference. However, any suitable phase training algorithm may, alternatively, be used.

Notably, in the proposed architecture, the 'I' and 'Q' quadrature signals in the respective 'I' and 'Q' paths are shifted by independent mixers. Although, such an independent shifting operation may cause some I-Q imbalance, any IQ imbalance due to a possible mixer mismatch is advantageously corrected by the loop. This is because during a normal transmission the phase shifted quadrature signals are advantageously connected to the up-mixer, as described later. Further, in one embodiment and in order to resolve a potential I-Q ambiguity problem, the proposed architecture utilises only one divide-by-2 quadrature generator, which is driven be a constant 2 F voltage controlled oscillator (VCO) signal. In particular, and advantageously, the use of frequency doublers and a single divide-by-2 quadrature generator may be utilised to provide a wideband solution.

Figure 3:
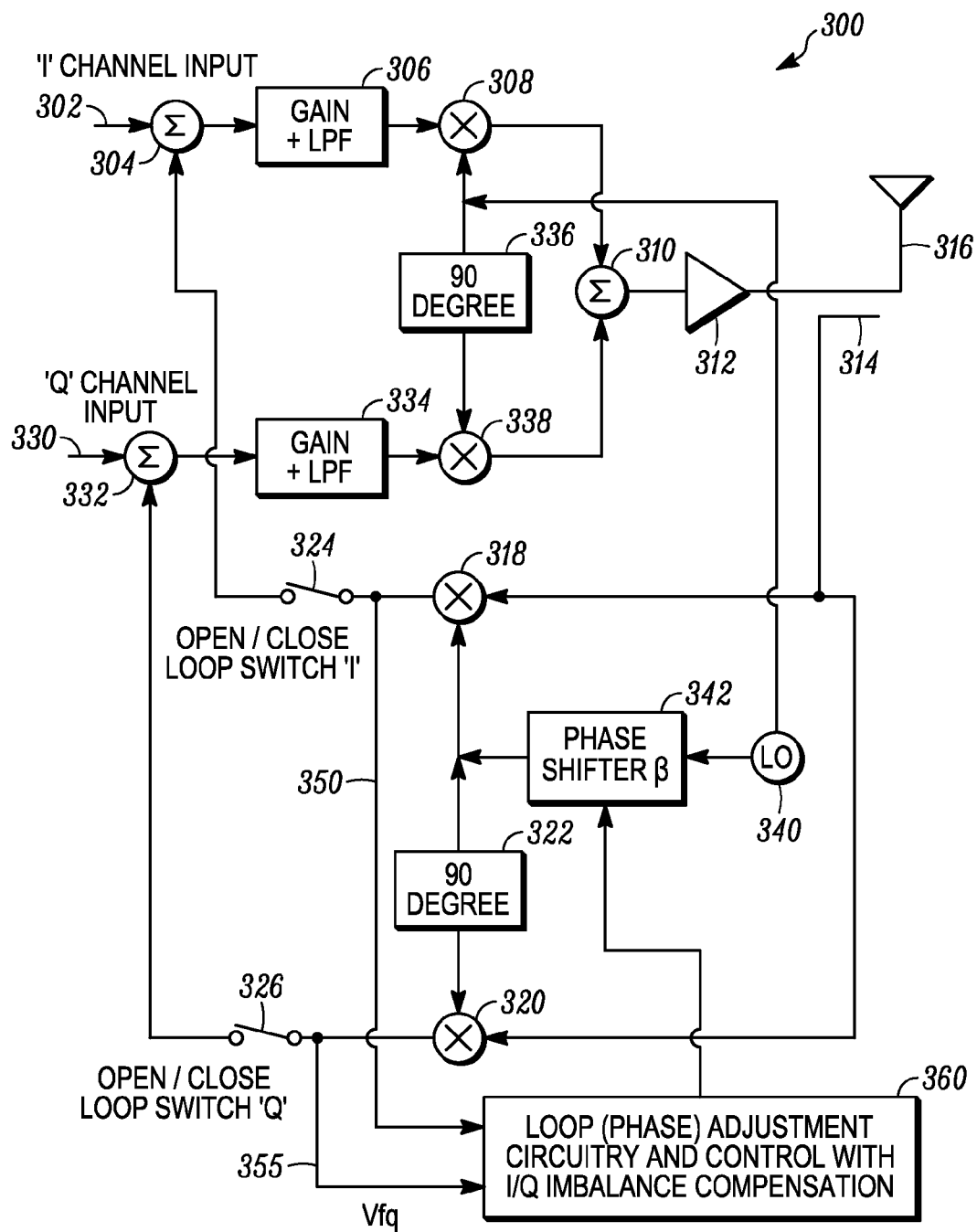
FIG. 3 illustrates a block diagram of a linearised transmitter topology adapted in accordance with embodiments of the invention.

FIG. 3 shows a more detailed Cartesian loop configuration 300, adapted to support embodiments of the invention. The configuration is described in a context of a phase training process, but clearly the same configuration may be used when transmitting real data.

A phase training signal, for example a sine wave, is input to an 'I'-channel 302. The phase training signal is not combined with any other signal in a summing junction 304, as the circuit has been arranged for open-loop operation by a controlling switch 324 (with a similar control for a 'Q'-channel with a switch 326). The input signal is then input to a gain and low-pass filter block 306 where it is amplified and filtered. The amplified input signal is then up-converted by mixing it with a signal from a local oscillator 340 in a mixer 308. The up-converted signal is then routed via summing logic 310 (where it is combined with an up-converted 'Q' channel signal) to an RF amplifier chain 312, where a portion of the amplified RF signal is fed back via directional coupler 314. The remaining RF signal is radiated from antenna 316.

The portion of the amplified RF signal is routed to a down-conversion mixer 318, where it is mixed with a phase-shifted 342 version of a signal from the local oscillator 340. In an open-loop configuration, where switch 324 is in an 'open' position, the phase training signal routed around the 'I' loop is input to phase training SAR circuitry and control 360, which determines a phase shift $V_{fI}$ around the 'I' loop. The subsequent amount of phase shift to be applied to compensate the phase shift is controlled by the phase training SAR circuitry and control 360.

A second phase training sequence is now applied to the 'Q'-channel input 330. The phase training signal is, in one embodiment the same sine wave that is input to the 'I'-channel. The phase training signal is not combined with any other signal in summing junction 332, as the circuit has been arranged for open-loop operation by controlling switch 326. The 'Q'-channel input signal is then input to a gain and low-pass filter block 334 where it is amplified and filtered. The amplified input signal is then up-converted by mixing it with a '90' degree 336 phase-shifted representation of a signal from the local oscillator 340 in a mixer 338. The up-converted signal is then routed via summing logic 310 (where it is combined with an up-converted 'I' channel signal) to an RF amplifier chain 312, where a portion of the amplified RF signal is fed back via directional coupler 314. The remaining RF signal is radiated from antenna 316.

The portion of the amplified RF signal is routed to a down-conversion mixer 320, where it is mixed with a phase-shifted 342 version of the local oscillator signal. The phase-shifted version of the local oscillator signal has been further phase shifted by ninety-degrees 322 to account for the ideal I-Q quadrature nature of the circuit. In an open-loop configuration, where switch 324 is in an 'open' position, the phase training signal routed around the 'Q' loop 355 is input to phase training SAR circuitry and control 360, which determines a phase shift $V_{fQ}$ around the 'Q' loop. The subsequent amount of phase shift to be applied to compensate the phase shift is controlled by the phase training SAR circuitry and control 360.

In this manner, the phase shift of both the 'I'-channel loop and the 'Q'-channel loop through all of the components up to the switch point is measured. Once the respective phase-shifts have been calculated, they are compensated for by appropriate adjustment of the phase-shifter, under control of the phase calculation and loop adjustment function within block 360.

Figure 4:
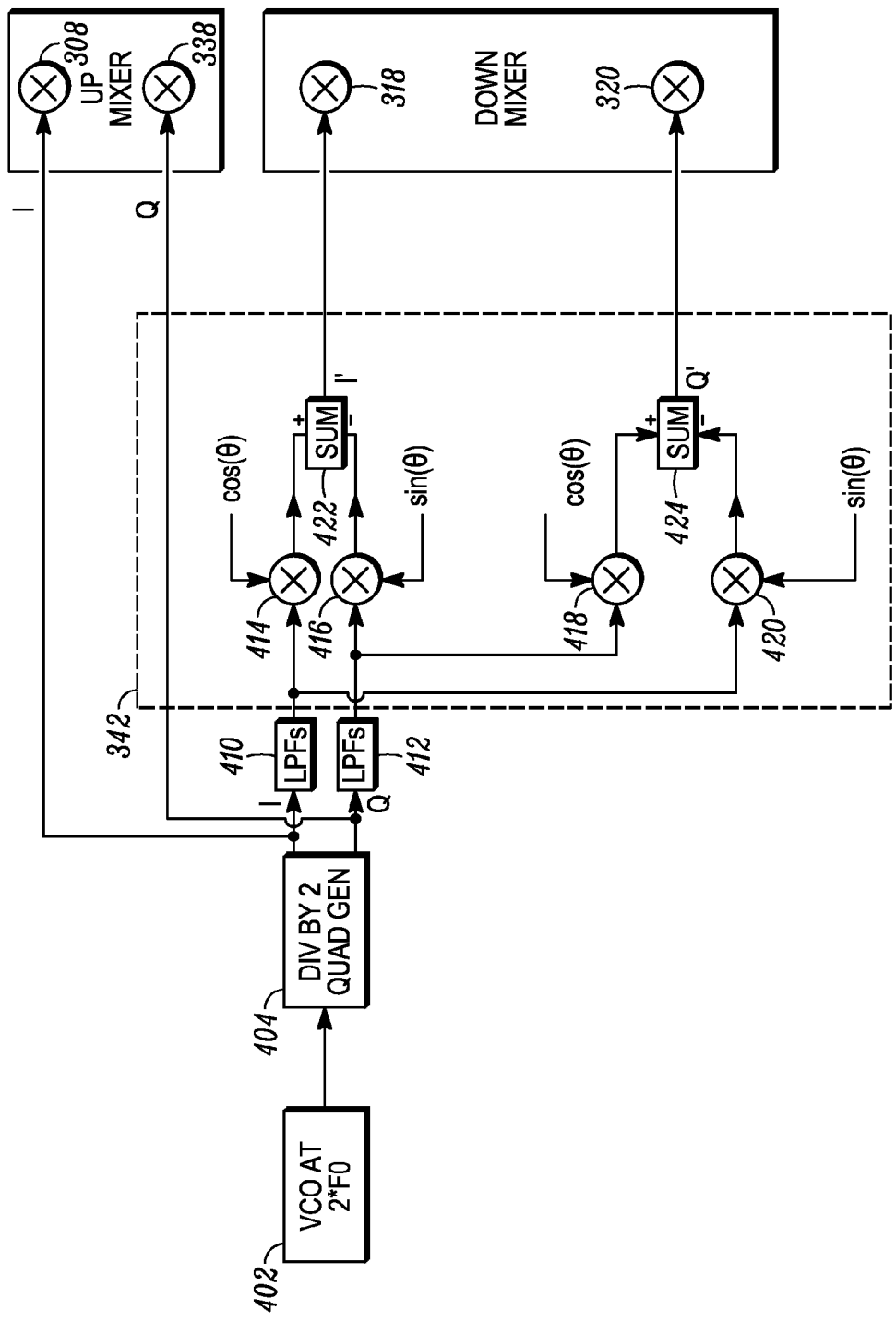
FIG. 4 illustrates a proposed quadrature signal generator in accordance with embodiments of the invention.

Referring now to FIG. 4, a more detailed diagram 400 of embodiments of the invention is illustrated. A voltage controlled oscillator (VCO) 402 is operably coupled to a linearised transmitter circuit (not shown). The linearised transmitter circuit comprises a forward path for routing a signal to be transmitted and a feedback path, operably coupled to a power amplifier and the forward path for feeding back a portion of the signal to be transmitted, wherein the feedback path and forward path form two loops in quadrature as shown in FIG. 3. The VCO 402 generates a frequency (at 2*F0, where F0 is the centre frequency of a signal to be used in up-mixing or down-mixing RF signals to be transmitted or received) that is supplied to a divide-by-2 quadrature generator 404, where 'I' and 'Q' quadrature signals are created. The use of a divide-by-2 quadrature generator is inherently, and advantageously, wideband in nature. This advantage emanates from the fact that a single divide-by-2 quadrature generator is built from flip-flops or latches, which makes it frequency independent. Thus, the frequency limit of a divide-by-2 quadrature generator is defined only by the internal transistor's maximum speed of switching.

The VCO generated 'I' and 'Q' quadrature signals are applied to quadrature up-mixers 308, 338 to quadrature frequency translate baseband digital signals to a radio frequency, as illustrated with respect to FIG. 3.

Notably, in accordance with embodiments of the invention, the 'I' and 'Q' quadrature signals are also applied to quadrature down-mixers 318, 320 to quadrature frequency translate radio frequency signals to baseband digital signals. In this embodiment, the VCO generated 'I' and 'Q' quadrature signals are filtered by low pass filters (LPFs) 410, 412, which filter out harmonics of the quadrature generated signals. Each filtered quadrature signal is then input to a phase shifter 342, where it is independently phase rotated by a required phase (during phase training) in open loop operation in quadrature (phase shifter) mixers 414, 416, 418, 420 and respectively summed in summing logic 422, 424.

Thus, the quadrature phase shifting mixers 414, 416, 418, 420 are arranged to independently phase shift the two loops in quadrature ('I' and 'Q') and receive a mixing source from the sin ☐and cos ☐inputs. Thus, the output of the respective summing logic 422, 424 are quadrature signals after independent phase rotation, which are termed I' and Q' [2].

$I'=I\cos(\vartheta)-Q\sin(\vartheta)=\cos(wt)\cos(\vartheta)-\sin(wt)\sin(\vartheta)=\cos(wt+\vartheta)$ $Q'=Q\cos(\vartheta)+I\sin(\vartheta)=\sin(wt)\cos(\vartheta)+\cos(wt)\sin(\vartheta)=\sin(wt+\vartheta)$ [2].

Further, in this manner and in normal closed-loop operation (when switches 324, 326 in FIG. 3 are closed), the quadrature 'I' and 'Q' signals are then able to be phase rotated by independent phase shifters (phase shifting mixers 414 and 416 for 'I'; 418 and 420 for 'Q') and applied to down-mixers 318, 320. Due to this independent phase rotation of the quadrature signals, the improved architecture requires only a single 'divide-by-2' quadrature generator 404 in the linearised transmitter integrated circuit.

It is envisaged that the aforementioned embodiments of the invention may be implemented using a signal processor function. More generally, elements of the inventive concept may be implemented in a wireless communication unit in any suitable manner for example by re-programming or adapting a processor in the wireless communication unit. For example, a new processor may be added to a conventional wireless communication unit, or alternatively existing parts of a conventional wireless communication unit may be adapted, for example by reprogramming one or more processors therein. As such the required adaptation may be implemented in the form of processor-implementable instructions stored on a storage medium, such as a floppy disk, hard disk, programmable read-only memory (PROM), random access memory (RAM) or any combination of these or other storage media.

In summary, a new quadrature generation architecture, and method of quadrature generation therefor for a Cartesian feedback loop linear transmitter has been described. In particular, the new architecture and method of performing phase corrections during a phase adjustment algorithm in a Cartesian feedback loop linear transmitter has been described. The aforementioned inventive concept provides a mechanism for compensating quadrature generator imbalances within the transmitter. Advantageously, I-Q imbalance of both forward and feedback quadrature generator circuits are compensated for, both of which influence the phase and amplitude adjustment/compensation calculations. Furthermore, as imbalances in the forward and backward quadrature generator circuits are compensated for, it is possible to use less expensive components with a reduced tolerance and performance.

Advantageously, the inventive concept of the invention provides a significant benefit to the manufacturers of linearised transmitter circuits, by compensating for quadrature imbalance in a wideband linearization architecture that utilises fewer components than current architectures. For example, it is also within the contemplation of the invention that alternative linearisation techniques can benefit from the inventive concepts described herein. As an alternative to using Cartesian feedback, a pre-distortion form of lineariser may be adapted to implement the embodiment or alternative embodiments of the invention. Y. Nagata described an example of a suitable pre-distortion transmitter configuration in the 1989 IEEE paper titled "Linear Amplification Technique for Digital Mobile Communications".

Nevertheless, it is within the contemplation of the invention that the transmitter configuration of embodiments of the invention may be applied to any wireless transmitter circuit.

Furthermore, it is within the contemplation of the invention that the wireless communication unit employing the linearised transmitter may be any wireless communication device, such as a portable or mobile PMR radio, a mobile phone, a personal digital assistant, a wireless laptop computer, etc. It is also envisaged that the inventive concepts described herein are not limited to use in subscriber equipment, but may also be utilised in other communication units such as base station equipment, e.g., a base station transceiver. It is further envisaged that embodiments of the invention described herein are not limited to use in a TETRA system, but may also be utilised in other types of communication systems.

It will be understood that the wireless communication unit, linearised transmitter circuits and methods of training, as described above, tend to provide at least one or more of the following advantages:
(i) quadrature 'I' and 'Q' signals are advantageously phase rotated by independent phase shifters. Thus, the improved architecture requires only a single 'divide-by-2' quadrature generator (quadrature generator 404 in FIG. 4) in the linearised transmitter integrated circuit;
(ii) the architecture may support wideband operation, for example 100 MHz-1 GHz, and possibly extended to 1-5 GHz; and
(iii) the proposed architecture may avoid a requirement for frequency doublers that cause high levels of far-out noise.

Those skilled in the art will realize that the above recognized advantages and other advantages described herein are merely exemplary and are not meant to be a complete rendering of all of the advantages of the various embodiments of the present invention.

In the foregoing specification, specific embodiments of the invention have been described. However, one of ordinary skill in the art appreciates that various modifications and changes can be made without departing from the scope of the invention as set forth in the claims below.

Accordingly, the specification and figures are to be regarded in an illustrative rather than a restrictive sense, and all such modifications are intended to be included within the scope of invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Moreover in this document, relational terms such as first and second, top and bottom, and the like may be used solely to distinguish one entity or action from another entity or action without necessarily requiring or implying any actual such relationship or order between such entities or actions.

The terms 'comprises,' 'comprising,' 'has', 'having,' 'includes', 'including,' 'contains', 'containing' or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by 'comprises . . . a', 'has . . . a', 'includes . . . a', 'contains . . . a' does not, without more constraints, preclude the existence of additional identical elements in the process, method, article, or apparatus that comprises, has, includes, contains the element. The terms 'a' and 'an' are defined as one or more, unless explicitly stated otherwise herein.

The terms 'substantially', 'essentially', 'approximately', 'about' or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term 'coupled' as used herein is defined as connected, although not necessarily directly and not necessarily mechanically. A device or structure that is 'configured' in a certain way is configured in at least that way, but may also be configured in ways that are not listed.

Thus, a wireless communication unit, a linearised transmitter integrated circuit and a method of linearising a transmitter have been described that substantially address the problems associated with known linearised transmitters.

We claim:

1. A wireless communication unit comprising:
a frequency generation circuit;
a phase shifter circuit operatively coupled to the frequency generation circuit;
down-mixers operably coupled to the phase shifter circuit;
a linearised transmitter operably coupled to the frequency generation circuit and having:
a forward path for routing a signal to be transmitted;
a feedback path, operably coupled to a power amplifier and the forward path for feeding back a portion of the signal to be transmitted, wherein the feedback path and forward path are operatively coupled to the frequency generation circuit and form two loops in quadrature,
wherein the wireless communication unit is characterised in that the phase shifter circuit comprises independent phase shift elements arranged to receive two input quadrature signals ('I' and 'Q') generated by the frequency generation circuit and to independently phase shift the two input quadrature signals to produce and provide two quadrature output signals to the down-mixers.

2. The wireless communication unit of claim 1 further characterised in that the independent phase shift elements comprise two phase shift elements in parallel arranged to independently phase shift each input quadrature signal.

3. The wireless communication unit of claim 2 further characterised in that the two phase shift elements in parallel receive quadrature mixing signals and produce the two quadrature output signals.

4. The wireless communication unit of claim 1 further characterised by a summer for combining the two quadrature output signals to produce a quadrature signal of at least one of the following forms:

$$I' = I\cos(\vartheta) - Q\sin(\vartheta) = \cos(wt)\cos(\vartheta) - \sin(wt)\sin(\vartheta) = \cos(wt+\vartheta)$$

$$Q' = Q\cos(\vartheta) + I\sin(\vartheta) = \sin(wt)\cos(\vartheta) + \cos(wt)\sin(\vartheta) = \sin(wt+\vartheta).$$

5. The wireless communication unit of claim 1 further characterised in that the independent phase shift elements are operably coupled to a filtering network arranged to filter harmonics of the input quadrature signals generated by the frequency generation circuit.

6. The wireless communication unit of claim 1 further characterised in that the frequency generation circuit comprises a single quadrature generator arranged to input quadrature signals to the independent phase shift elements.

7. The wireless communication unit of claim 6 further characterised in that the single quadrature generator is a single divide-by-2 quadrature generator driven by a constant VCO signal.

8. The wireless communication unit of claim 1 wherein the wireless communication unit is capable of operation on a TETRA communication system.

9. A linearised transmitter integrated circuit comprising:
a frequency generation circuit;
a phase shifter circuit operatively coupled to the frequency generation circuit;
down-mixers operatively coupled to the phase shifter circuit;
a forward path for routing a signal to be transmitted;
a feedback path, capable of being operably coupled to a power amplifier and the forward path for feeding back a portion of the signal to be transmitted, wherein the feedback path and forward path are operatively coupled to the frequency generation circuit and form two loops in quadrature,
wherein the linearised transmitter integrated circuit is characterised in that the phase shifter circuit comprises independent phase shift elements arranged to receive two input quadrature signals ('I' and 'Q') generated by the frequency generation circuit and to independently phase shift the two input quadrature signals to produce and provide two quadrature output signals to the down-mixers.

10. The linearised transmitter integrated circuit of claim 9 further characterised in that the independent phase shift elements comprise two phase shift elements in parallel arranged to independently phase shift each input quadrature signal.

11. The linearised transmitter integrated circuit of claim 10 further characterised in that the two phase shift elements in parallel receive quadrature mixing signals and produce the two quadrature output signals.

12. The linearised transmitter integrated circuit of claim 9 further characterised by a summer for combining the two quadrature output signals to produce a quadrature signal of at least one of the following forms:

$$I'=I\cos(\vartheta)-Q\sin(\vartheta)=\cos(wt)\cos(\vartheta)-\sin(wt)\sin(\vartheta)=\cos(wt+\vartheta)$$

$$Q'=Q\cos(\vartheta)+I\sin(\vartheta)=\sin(wt)\cos(\vartheta)+\cos(wt)\sin(\vartheta)=\sin(wt+\vartheta).$$

13. The linearised transmitter integrated circuit of claim 9 further characterised in that the independent phase shift elements are operably coupled to a filtering network arranged to filter harmonics of the input quadrature signals generated by the frequency generation circuit.

14. The linearised transmitter integrated circuit of claim 9 further characterised in that the frequency generation circuit comprises a single quadrature generator operably coupled to the independent phase shift elements.

15. The linearised transmitter integrated circuit of claim 9 wherein the linearised transmitter integrated circuit is capable of operation on a TETRA communication system.

16. A method of linearising a transmitter in a wireless communication unit comprising a linearised transmitter having a frequency generation circuit, a phase shifter circuit, down-mixers, a forward path for routing a signal to be transmitted and a feedback path for feeding back a portion of the signal to be transmitted, wherein the feedback path and forward path form two loops in quadrature, the method characterised by the step of:
receiving two input quadrature signals ('I' and 'Q') generated by the frequency generation circuit; and
independently phase shifting, by independent phase shift elements in the phase shifter circuit, the two input quadrature signals to produce and provide two quadrature output signals to the down-mixers.

17. The method of claim 16 further characterised by:
receiving, by two phase shift elements in parallel included within the phase shifter circuit, quadrature mixing signals; and
producing the two quadrature output signals.

18. The method of claim 16 further characterised by:
combining the two quadrature output signals to produce a quadrature signal of at least one of the following forms:

$$I'=I\cos(\vartheta)-Q\sin(\vartheta)=\cos(wt)\cos(\vartheta)-\sin(wt)\sin(\vartheta)=\cos(wt+\vartheta)$$

$$Q'=Q\cos(\vartheta)+I\sin(\vartheta)=\sin(wt)\cos(\vartheta)+\cos(wt)\sin(\vartheta)=\sin(wt+\vartheta).$$

19. The method of claim 16 further characterised by:
filtering harmonics of the input quadrature signals generated by the frequency generation circuit prior to independently phase shifting the two input quadrature signals.

20. The method of claim 16 further characterised by applying the method to a wireless communication unit capable of operation on a TETRA communication system.

* * * * *

UNITED STATES PATENT AND TRADEMARK OFFICE
CERTIFICATE OF CORRECTION

PATENT NO. : 8,139,676 B2  Page 1 of 1
APPLICATION NO. : 11/623842
DATED : March 20, 2012
INVENTOR(S) : Ben-Ayun et al.

It is certified that error appears in the above-identified patent and that said Letters Patent is hereby corrected as shown below:

In Column 3, Line 17, delete " ☐ " and insert -- ☐ --, therefor.

Signed and Sealed this
Eighteenth Day of December, 2012

David J. Kappos
*Director of the United States Patent and Trademark Office*